United States Patent
Stirton et al.

(10) Patent No.: US 6,808,946 B1
(45) Date of Patent: Oct. 26, 2004

(54) METHOD OF USING CRITICAL DIMENSION MEASUREMENTS TO CONTROL STEPPER PROCESS PARAMETERS

(75) Inventors: James Broc Stirton, Austin, TX (US); Richard D. Edwards, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 25 days.

(21) Appl. No.: 10/195,934

(22) Filed: Jul. 16, 2002

(51) Int. Cl.$^7$ .............................................. H01L 21/66
(52) U.S. Cl. ........................... 438/16; 355/52; 430/312
(58) Field of Search ........................................... 438/16

(56) References Cited
U.S. PATENT DOCUMENTS 6,639,651 B2 * 10/2003 Matsuyama .................. 355/52

* cited by examiner

*Primary Examiner*—Douglas Wille
(74) *Attorney, Agent, or Firm*—Williams, Morgan & Amerson, P.C.

(57) ABSTRACT

A method of using critical dimension measurements to control stepper process parameters is disclosed. In one illustrative embodiment, the method comprises forming a masking layer above a process layer, the masking layer having a plurality of features formed therein, measuring at least one critical dimension of a plurality of features positioned within at least one exposure field of a stepper exposure process used in forming the features, and determining a tilt of the masking layer within at least one exposure field based upon the measured critical dimensions of the plurality of features. In one illustrative embodiment, the system comprises a metrology tool adapted to measure at least one critical dimension of a plurality of features in a masking layer and a controller for determining a tilt of the masking layer based upon the measured critical dimensions of said plurality of features.

49 Claims, 5 Drawing Sheets

METHOD OF USING CRITICAL DIMENSION MEASUREMENTS TO CONTROL STEPPER PROCESS PARAMETERS

BACKGROUND OF THE INVENTION

1. Field of the Invention

This invention relates generally to semiconductor fabrication technology, and, more particularly, to a method of using critical dimension measurements to control stepper process parameters, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of, for example, silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.18 $\mu$m (1800 Å), and further reductions are anticipated in the future. As stated previously, the width 12 of the gate electrode 14 corresponds approximately to the channel length 13 of the transistor 10 when it is operational. Thus, even slight variations in the actual width dimension 12 of the gate electrode 14 as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a patterned layer of photoresist above one or more layers of material that are desired to be patterned, and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

FIGS. 2 and 3 depict an illustrative embodiment of a wafer 11 that may be subjected to an exposure process in a stepper tool. In general, the stepper exposure process is performed on a stack comprised of one or more process layers or films and a layer of photoresist. For example, as shown in FIG. 2, such a stack may be comprised of a layer of polysilicon 36, formed above the substrate 11, and a layer of photoresist 38. Alternatively, an anti-reflective coating (ARC) layer (not shown) may be positioned above the layer of polysilicon 36 and below the layer of photoresist 38. Of course, such film stacks may be comprised of a vast variety of combinations of process layers and materials.

As shown in FIG. 3, a plurality of die 42 are formed above the wafer 11. The die 42 define the area of the wafer 11 where production integrated circuit devices, e.g., microprocessors, ASICs, memory devices, etc., will be formed. The size, shape and number of die 42 per wafer 11 depend upon the type of device under construction. For example, several hundred die 42 may be formed above an 8-inch diameter wafer 11. The wafer 11 may also have an alignment notch 17 that is used to provide relatively rough alignment of the wafer 11 prior to performing certain processes, e.g., an exposure process in a stepper tool.

As shown in FIG. 2, the stepper tool contains a representative light source 47 that is used to project light through a reticle (not shown) onto a layer of photoresist 38. Ultimately, the image in the reticle will be transferred to the layer of photoresist 38, and the underlying process layer 36 will be patterned using the patterned layer of photoresist 38 as a mask during one or more subsequent etching processes.

The exposure process performed on the wafer 11 is typically performed on a flash-by-flash basis as the wafer 11 is moved, or stepped, relative to the light source 47. During each step, the light source 47 projects light onto a given area of the wafer 11, i.e., each flash is projected onto an exposure field 41 (see FIG. 3). The size of the exposure field 41, as well as the number of die 42 within each exposure field 41, may vary greatly. For example, an illustrative exposure field 41 is depicted in FIG. 3 wherein four of the die 42 fall within the exposure field 41, i.e., a so-called 2×2 pattern. However, the number of die 42 and size of the exposure field 41 may vary. For example, integrated circuits may be exposed using a 1×2 pattern (covering 2 die), a 5×5 pattern (covering 25 die), etc. The precise pattern of the exposure field 41 may be based upon the product under construction as well as the desires and judgment of the appropriate process engineer.

One parameter of the stepper exposure process that is of critical importance is the location of the focal plane of the stepper. In general, the focal plane of the stepper is the point where the image plane and the object plane coincide. The location of the focal plane may vary based upon a variety of factors, e.g., the type of photoresist material used, the composition of the underlying process layers, the thickness of the layer of photoresist, etc. Ideally, the focal plane will be located at a position that produces acceptable DICD dimensions and profiles in the layer of photoresist 38. In the illustrative example depicted in FIG. 2, the focal plane of the stepper tool is located at the approximate middle of the layer of photoresist 38, as indicated by the lines 39. The focal plane may be located at the line 39 within the layer of photoresist 38, as indicated in FIG. 2, or it may be located at another point, i.e., at the surface 43 of the layer of photoresist 38. The location of the focal plane may vary greatly based upon a number of factors, such as the type and thickness of the layer of photoresist 38, as well as the composition and thickness of the underlying process layers.

Due to a variety of reasons, the thickness of the layer of photoresist 38, as well as the position of its surface 43 relative to the light source 47, may vary across the wafer 11 and among the various exposure fields 41. As a result, the ideal location of the focal plane for the stepper exposure process may vary among the exposure fields 41. For example, the layer of photoresist 38 within a particular exposure field 41 may be thinner than anticipated. As a result, the focal plane of the stepper may be positioned above the ideal location, thereby producing features in the layer of photoresist 38 in that exposure field 41 with rounded corners of a magnitude that are unacceptable. In turn, this may result in distortion of the features in the underlying process layer 36.

Normally, it is desirable that the surface 43 of the layer of photoresist 38 will be positioned approximately perpendicular to the incident light from the light source 47 during the exposure process. This is desired to reduce the magnitude of diffracted light from the light source. However, for a variety of reasons, the surface 43 of the layer of photoresist 38 may be tilted in one or more directions as indicated by the dashed line 43 A and the angle 44. Accordingly, most modern stepper tools are provided with means for compensating for the tilt in the layer of photoresist 38, e.g., by adjusting the tilt of the reticle (not shown) and/or the tilt of the light projected from the light source 47 within the stepper, such that the approximately perpendicular relationship is maintained between the tilted surface 43 of the layer of photoresist 38 and the light from the light source 47. Variations in the tilt of the surface 43 of the layer of photoresist 38 may occur for a number of reasons, e.g., underlying topography, excessive spinning during the process of forming the layer of photoresist 38, variations in the temperature of the photoresist, variations in cool plate or oven temperatures, etc. Moreover, such tilt variations may be different in different exposure fields 41 of the wafer 11.

Variations that may occur during stepper exposure processes, such as variations in the location of the focal plane and the tilt of the surface 43 of the layer of photoresist 38, may result in the features formed in the patterned layer of photoresist 38 having undesirable characteristics. For example, if a layer of photoresist 38 is exposed with the focal plane located above the desired location of the focal plane, the features formed in the patterned layer of photoresist 38 will have rounded corners on top of the photoresist. As a result, features formed in the underlying process layer will exhibit similar characteristics. On the other hand, if the layer of photoresist 38 is exposed using a focal plane that is located below the desired location of the focal plane, the features in the underlying process layer 36 will tend to exhibit undercutting. Performing the exposure process in exposure fields 41 wherein the surface 43 of the layer of photoresist 38 is not substantially perpendicular to the light generated by the stepper tool, results in similar problems.

In turn, such problems may lead to excessive rework of the patterned layer of photoresist 38, i.e., the incorrectly formed layer of photoresist 38 may have to be removed, and the process may have to be repeated. Even worse, if undetected, the variations in the patterned layer of photoresist 38 resulting from variations in the tilt angle and/or location of the focal plane of the exposure process may ultimately lead to the formation of features, e.g., gate electrodes, having dimensions that are not acceptable for the particular integrated circuit device under construction. For example, transistors may be produced with gate electrodes that are too wide (relative to a pre-established target value), thereby producing transistor devices that operate at less than desirable switching speeds. All of these problems result in delays, waste, excessive costs and cause reduced yields of the manufacturing operations.

The present invention is directed to a method and system that may solve, or at least reduce, some or all of the aforementioned problems.

SUMMARY OF THE INVENTION

The present invention is generally directed to a method of using critical dimension measurements to control stepper process parameters. In one illustrative embodiment, the method comprises forming a masking layer above a process layer, the masking layer having a plurality of features formed therein, measuring at least one critical dimension of a plurality of features positioned within at least one exposure field of a stepper exposure process used in forming the features, and determining a tilt of the masking layer within at least one exposure field based upon the measured critical dimensions of the plurality of features.

In one illustrative embodiment, the system comprises a metrology tool adapted to measure at least one critical dimension of a plurality of features in a masking layer and a controller for determining a tilt of the masking layer based upon the measured critical dimensions of said plurality of features.

BRIEF DESCRIPTION OF THE DRAWINGS

The invention may be understood by reference to the following description taken in conjunction with the accompanying drawings, in which like reference numerals identify like elements, and in which.

Figure 1:
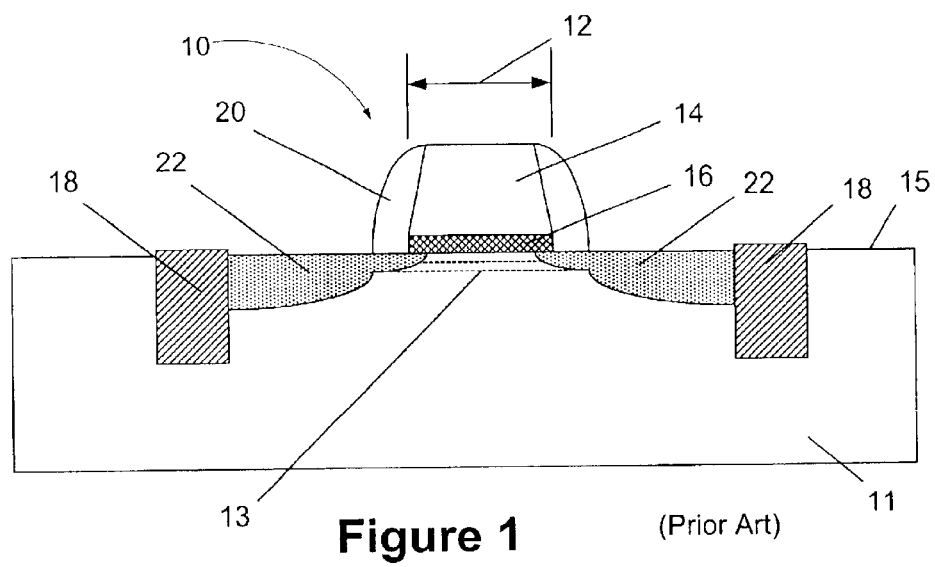
FIG. 1 is a cross-sectional view of an illustrative prior art transistor.
Figure 2:
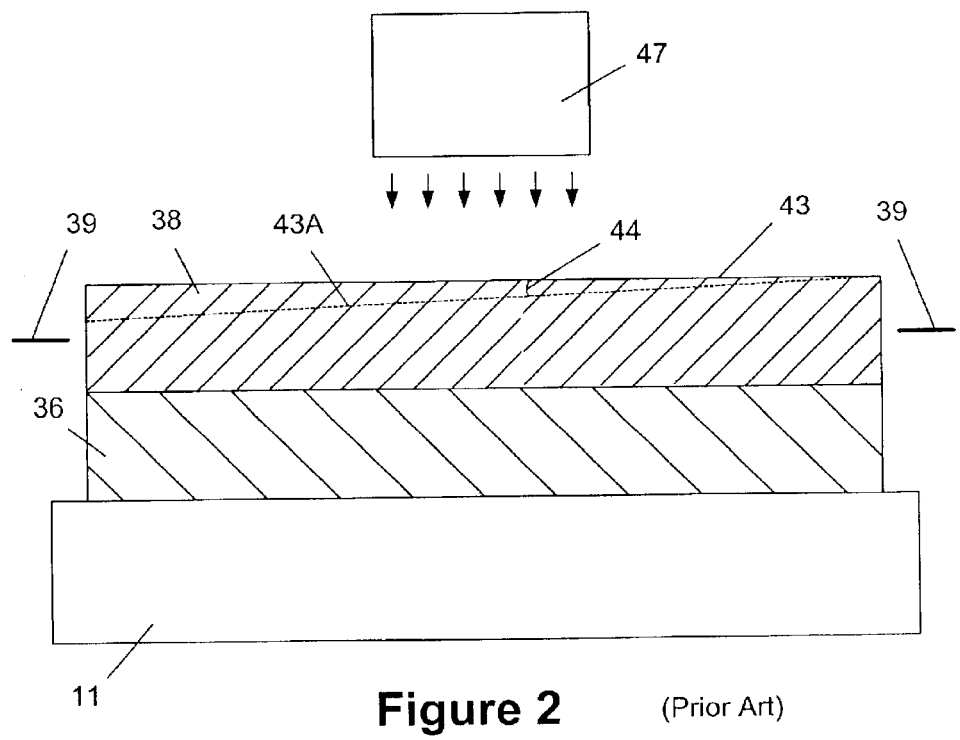
FIG. 2 is a cross-sectional view depicting an illustrative prior art wafer having a process layer and a layer of photoresist formed thereabove.
Figure 3:
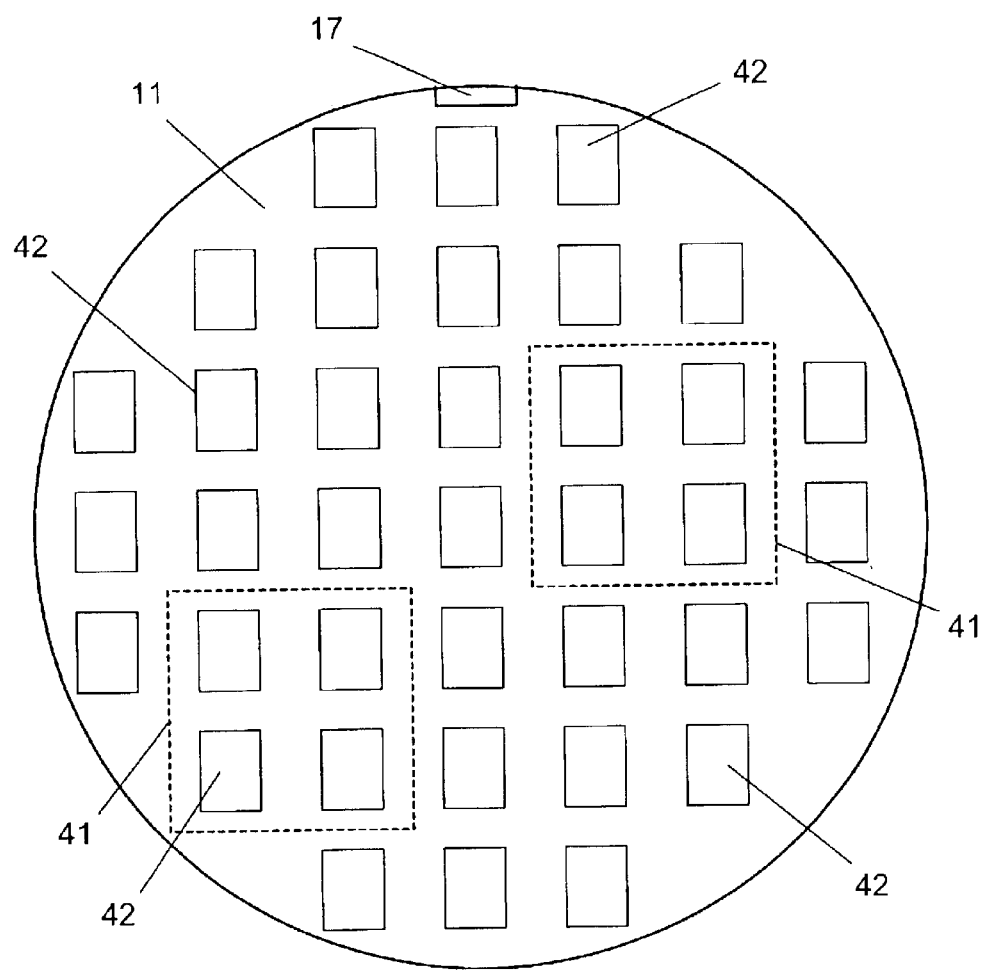
FIG. 3 is a plan view of an illustrative prior art wafer having a plurality of die formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to a method of using critical dimension measurements of features formed in a masking layer to control stepper process parameters, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

More particularly, the photolithography process generally involves the steps of: (1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist, (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

Figure 4:
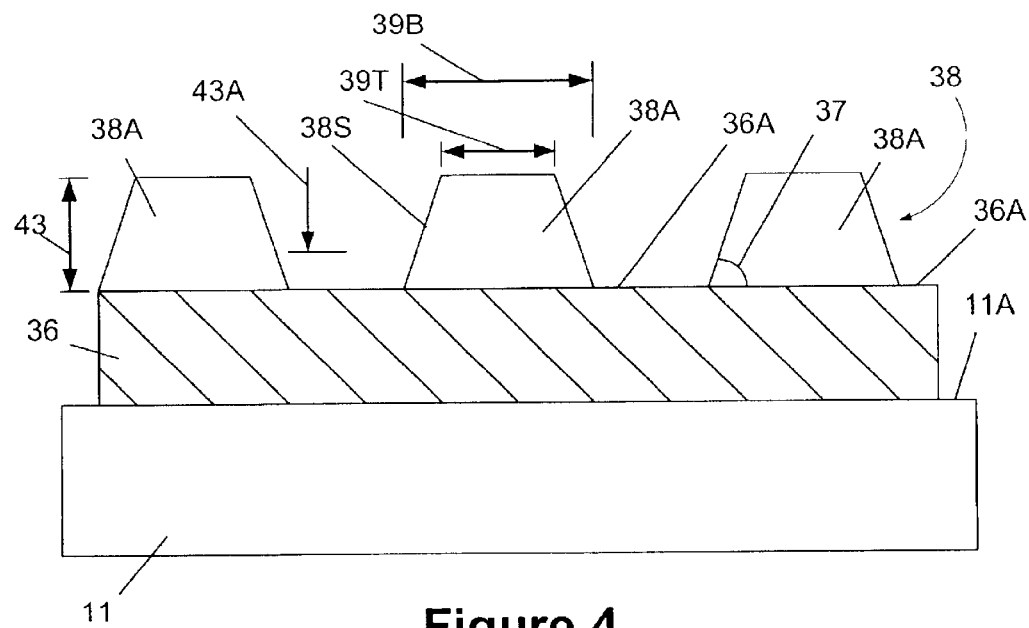
FIG. 4 is a cross-sectional view of an illustrative patterned masking layer that is formed above an illustrative process layer.

FIG. 4 depicts a representative process layer 36 that is formed above a semiconducting substrate 11, and a patterned masking layer 38 that is comprised of a plurality of features 38A. Only three such features 38A are depicted in FIG. 4 for purposes of clarity. It should be understood that the process layer 36 is intended to be representative in nature in that it represents any type of layer of material that may be formed in modern semiconducting manufacturing processes. Moreover, the process layer 36 may be formed on the surface 11A of the substrate 11 or at any location thereabove. For example, the process layer 36 may be a layer of polysilicon that will subsequently be patterned using one or more known etching processes. Such patterning may result in the formation of a plurality of gate electrode structures (not shown) in the layer of polysilicon. Thus, the present invention should not be considered as limited to any particular type of material or the formation of any particular type of feature in the process layer 36 unless such limitations are clearly set forth in the appended claims.

Similarly, the masking layer 38 may be comprised of a photoresist material, either positive or negative. The masking layer 38 may be formed by a variety of techniques, such as a spin-coating technique. In some applications, the masking layer 38 may be a so-called "hard mask" layer comprised of, for example, silicon dioxide. Thus, the masking layer 38 should not be considered as limited to any particular type of material unless such limitations are clearly set forth in the appended claims.

Using current-day processing techniques, the masking layer 38 will normally be a patterned layer of photoresist material, either positive or negative, and it will be comprised of a plurality of photoresist features 38A. The size, shape and configuration of the features 38A will vary depending upon the particular device or feature under construction. The photoresist features 38A may have a height 43 that is approximately 400 nm (4000 Å). The height 43 corresponds approximately to the thickness of the layer of photoresist material.

Figure 5:
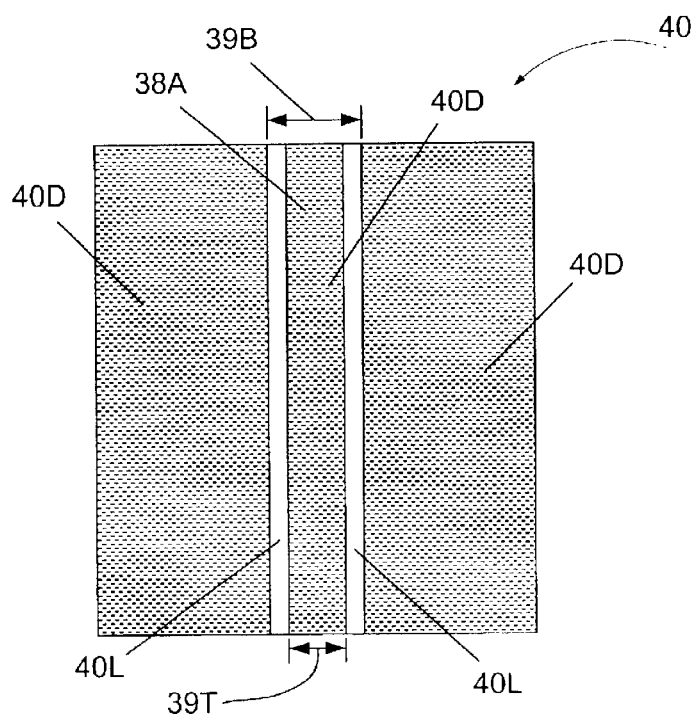
FIG. 5 is a schematic depiction of the results obtained from using a scanning electron microscope to measure the critical dimension of a feature.

Each photoresist feature 38A also has a top critical dimension 39T and a bottom critical dimension 39B. The top and bottom critical dimensions 39T, 39B may be measured or determined using a variety of metrology tools, such as a scanning electron microscope (SEM), a tunneling electron microscope (TEM) and a scatterometer. Typically, a scanning electron microscope is the metrology tool of choice for determining the critical dimension of a feature in current-day semiconductor manufacturing operations. FIG. 5 is an illustrative schematic depiction of an image 40 produced by a scanning electron microscope when measuring one of the photoresist features 38A depicted in FIG. 4. As shown therein, the image 40 is comprised of a plurality of dark regions 40D and a plurality of light regions 40L. The corresponding top and bottom critical dimensions 39T, 39B are depicted in FIG. 5. Of course, as will be understood by those skilled in the art, the reference to the critical dimensions 39T, 39B being at the "top" and "bottom" does not mean that the measurements are taken precisely at the exact bottom or top of the feature 38A. For example, with reference to FIG. 4, due to the physics of how a scanning electron microscope works, it may not be possible to measure the critical dimension 39B precisely at the depth where the feature 38A meets the upper surface 36A of the process layer 36. That is, the scanning electron microscope may not be able to provide meaningful results for the full depth of height 43 of the photoresist feature 38A. For example, the scanning electron microscope may only be able to provide useful information at a depth 43A that corresponds to approximately ⅔ of the height 43 of the feature 38A. Nevertheless, it should be understood that, by reference to the bottom critical dimension 39B of the feature 38A, the present application is referring to the critical dimension of the feature 38A at a depth that may readily be ascertained using existing metrology tools.

In general, the present invention involves measuring the top and bottom critical dimensions 39T, 39B of a plurality of photoresist features 38A within an exposure field 41, and using that information to control or confirm one or more parameters of an exposure process to be performed on a subsequently processed substrate.

Figure 6:
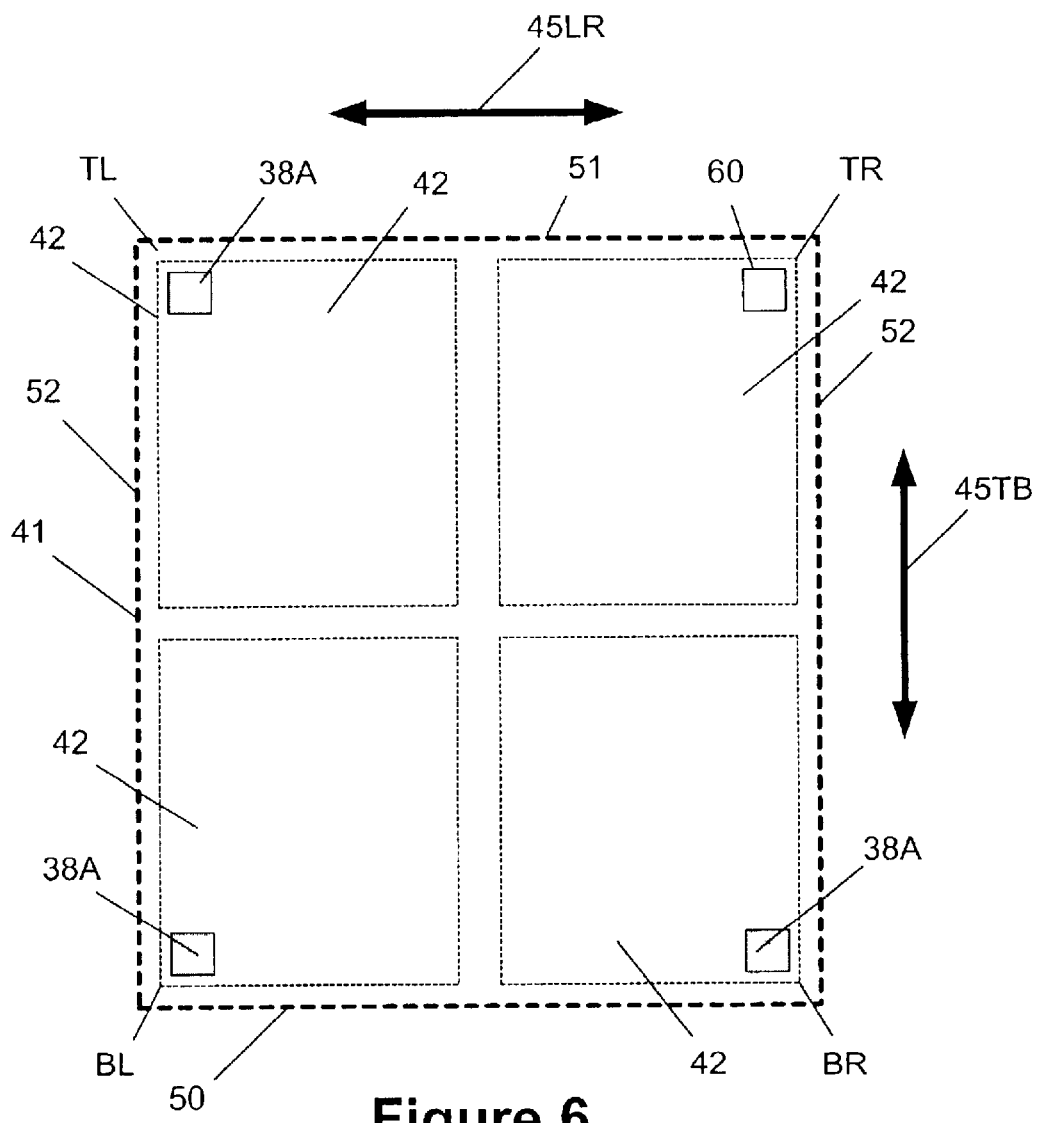
FIG. 6 is an illustrative embodiment of the present invention depicting the use of critical dimension metrology data to control one or more aspects of a stepper exposure process.

FIG. 6 depicts an illustrative exposure field 41 of a stepper exposure process used to expose a layer of photoresist 38. The particular exposure field 41 depicted in FIG. 6 is defined by a bottom edge 50, a top edge 51 and side edges 52. The depicted exposure field 41 encompasses four die 42 (indicated by dashed lines) formed above the wafer 11. Of course, the size and shape of the exposure field 41 may be varied as a matter of design choice. Also shown in FIG. 6 are a plurality of photoresist features 38A that are formed in the layer of photoresist. For purposes of clarity, the entirety of the layer of photoresist is not depicted in FIG. 6. The features 38A may be formed above the production die 42, as indicated in FIG. 6, or they may be formed in the scribe lines between the production die 42 but still within the exposure field 41. Ultimately, the top and bottom critical dimensions 39T, 39B of these photoresist features 38A will be measured, and these measurements will be used to determine, confirm and/or control one or more parameters of a stepper exposure process to be performed on a subsequently processed wafer.

The photoresist features 38A that are to be measured in accordance with the present invention are physically spaced apart within the exposure field 41. For example, in the illustrative embodiment depicted in FIG. 6, the present invention may involve measurement of a single photoresist feature 38A located proximate each of the corners (TL—top left, TR—top right, BL—bottom left, and BR—bottom right) of the exposure field 41. The exact spacing and location of the plurality of features 38A depicted in FIG. 6 may be varied from that depicted in the drawings as long as the selection and spacing of the features 38A provides meaningful feedback as to the tilt of the layer of photoresist 38 within the exposure field 41. Moreover, it should be understood that although a single photoresist feature 38A is depicted proximate each of the corners of the exposure field 41, the single feature 38A may be representative of a sample of such features 38A that are positioned proximate the corners of the exposure field 41. That is, for example, four or five features 38A positioned proximate the top left (TL) corner of the exposure field 41 may have their top and bottom critical dimensions 39T, 39B measured, and such results may be averaged or otherwise statistically compared to arrive at a nominal or average value for the top and bottom critical dimensions 39T, 39B of features 38A formed adjacent or proximate the top left (TL) corner of the exposure field 41.

The absolute values of the top and bottom critical dimensions 39T, 39B will vary depending upon the device under construction. By way of example only, in the situation where gate electrode structures are to be formed for a modern-day, high performance microprocessor, the photoresist features 38A depicted in FIG. 4 may have a top critical dimension 39T of approximately 120–150 nm, while the bottom critical dimension 39B may be approximately 180 nm.

Figure 8:
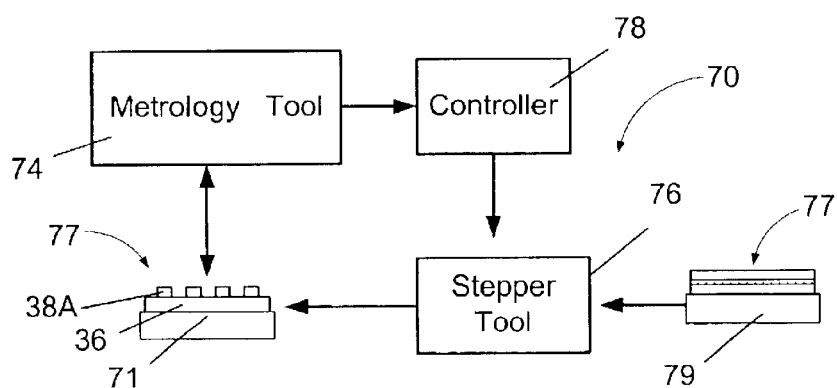
FIG. 8 depicts an illustrative embodiment of a system in accordance with one embodiment of the present invention.

An illustrative system 70 that may be used in one embodiment of the present invention is shown in FIG. 8. The system 70 is comprised of a metrology tool 74, a stepper tool 76, and a controller 78. As indicated in FIG. 8, the wafer 71 is representative of one or more wafers, having a film stack comprised of at least one process layer 36 and a patterned layer of photoresist 38 formed thereabove, that has previously been processed in the stepper tool 76. As a result, the wafer 71 has a plurality of features 38A formed thereabove. This patterned layer of photoresist 38 will be used in patterning the underlying process layer 36 by performing one or more known etching processes.

A variety of metrology tools 74 may be used with the present invention. For example, a scanning electron microscope, a tunneling electron microscope and a scatterometer may be employed with the present invention to measure or determine the critical dimensions described herein.

In the illustrated embodiments, the controller 78 is a computer programmed with software to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the stepper tool 76 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999—Provisional Specification for CIM Framework Advanced Process Control Component) specifications are publicly available from SEMI.

By measuring and comparing the measured values for the top and bottom critical dimensions 39T, 39B of the feature 38A, the TOP/BOTTOM TILT 45TB and LEFT/RIGHT TILT 45LR of the layer 38 may be determined. For ease of reference, the TOP/BOTTOM TILT 45TB and LEFT/RIGHT TILT 45LR may be referred to as, respectively, the vertical tilt and horizontal tilt of the layer 38.

As an initial matter, an effective profile (EP) for each measured feature 38A may be determined as follows:

$$EP = \text{BOTTOM } CD \text{ (39B)} - \text{TOP } CD \text{ (39T)}$$

In this example, the effective profile (EP) of the feature 38A is determined based upon the difference between the bottom critical dimension 39B and the top critical dimension 39T of the feature 38A. Determining the effective profile (EP) of the feature 38A based only upon the difference in critical dimension measurements may be appropriate in situations where the critical dimensions of the features 38A are always maintained within a very tight tolerance and/or when the processes are specifically dedicated to forming only certain types of features on certain types of products, e.g., gate electrodes for microprocessor devices. In other situations, it may be more desirable that the system employing the present invention be provided with normalized results as to the effective profile of the features 38A. For example, a semiconductor foundry may wish to determine the effective profile of the features 38A on a normalized basis given the variations in parts manufactured by the foundry during any given period. If normalized values with respect to the bottom critical dimension 39B are desired, then the effective profile (EP) of the feature may be determined as follows:

$$EP = \frac{\text{BOTTOM } CD \text{ (39B)} - \text{TOP } CD \text{ (39T)}}{\text{BOTTOM } CD \text{ (39B)}}$$

To determine the TOP/BOTTOM TILT (45TB) of the layer 38, the following equation may be used:

$$\text{TOP/BOTTOM TILT (45TB)} = \frac{(EP_{TL} + EP_{TR}) - (EP_{BL} + EP_{BR})}{2}$$

The LEFT/RIGHT TILT (45LR) of the layer 38 may be determined by the following equation:

$$\text{LEFT/RIGHT TILT (45LR)} = \frac{(EP_{TL} + EP_{BL}) - (EP_{TR} + EP_{BR})}{2}$$

The values for the TOP/BOTTOM TILT 45TB and LEFT/RIGHT TILT 45LR may be related to an arbitrarily selected reference system or standard. That is, a tilt in a given direction may be a positive number, while a tilt in the opposite direction may be a negative number. Any reference system may be selected so long as it is consistently applied.

Using the values determined for TOP/BOTTOM TILT (45TB) and LEFT/RIGHT TILT (45LR), control of one or more aspects of the stepper exposure process to be performed on subsequently processed wafers may be accomplished. As an initial matter, metrology data may be collected regarding the critical dimensions, both top and bottom, of the photoresist features 38A formed during the photolithography process. By performing a variety of engineering tests, an ideal profile or effective profile for a feature 38A may be determined. In some cases, the ideal profile will be represented by a range of acceptable values. In general, such testing may be done by comparing the profiles of features (not shown) formed in the process layer 36 with the critical dimensions 39T, 39B and an effective profile (EP) of the features 38A used in forming the features in the process layer 36. Simply put, the engineering studies can be used to determine the critical dimensions (or range of such dimensions) for features 38A in the masking layer 38 that produce acceptable results in the features formed in the underlying process layer 36.

The above-described information can be used to control one or-more aspects of the stepper exposure process. Based upon this information, it may be determined that, for example, as long as the TOP/BOTTOM TILT (45TB) is less than a certain preselected or established value, e.g., 10 nm, then the photolithography process is producing photoresist features 38A having an acceptable effective profile (EP) such that features (not shown) formed on the underlying process layer 36 are acceptable for the device under construction. A similar acceptable value for the LEFT/RIGHT TILT (45LR) of the layer 38 may be determined. Additionally, a composite value for these two parameters may also be determined if desired.

In other embodiments of the present invention, the tilt of the layer 38 may be determined by comparing only the top critical dimension measurements or the bottom critical dimension measures of the features 38A. Thus, it is not required that both top and bottom critical dimensions of the features 38A be measured in all cases.

In other cases, it may be desirable to determine one or more characteristics of the sidewalls 38S (see FIG. 4) of the feature 38A. That is, it may be desirable to determine the angle 37 the sidewall 38S makes with respect to a vertical line that is normally the surface 36A of the process layer 36. For example, if the angle 37 gets too large, the feature 38A will tend to produce features in the process layer 36 that exhibit undesirable profiles. If desired, the angle 37 may be determined from the following formula:

$$\Theta = \text{Arctan}\left(\frac{2h}{\text{BOTTOM } CD \text{ } (39B) - \text{TOP } CD \text{ } (39T)}\right)$$

where h=height 43 of the layer of photoresist 38.

Figure 7:
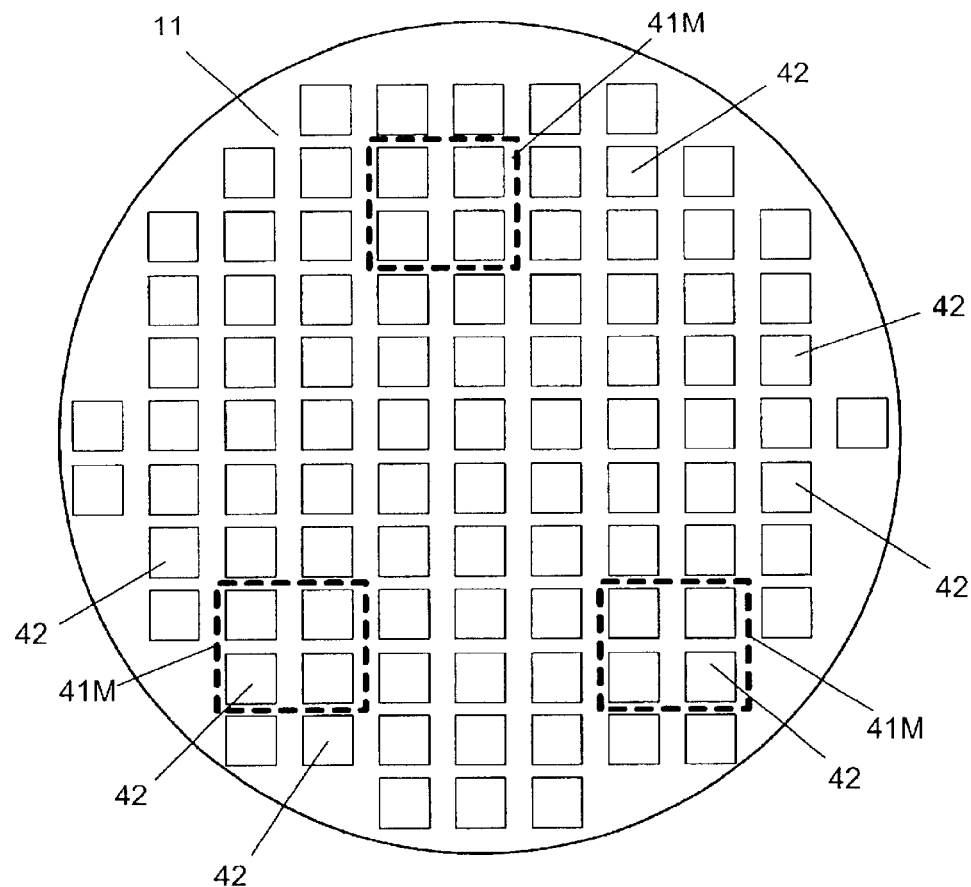
FIG. 7 is a plan view of an illustrative wafer depicting a plurality of regions that may be measured in accordance with one illustrative embodiment of the present invention.

The number of exposure fields 41 wherein the measurements described herein may be performed can vary. For example, as shown in FIG. 7, the measurements described herein may be performed in three measured exposure fields 41M. Generally, meaningful control operations may be accomplished based upon the measurement of 2–4 exposure fields per wafer. More exposure fields 41 can be measured if desired. The results from these multiple measured exposure fields 41 can be averaged or otherwise statistically compared to arrive at an overall, across-wafer tilt for the layer 38 in both a vertical and horizontal direction. Alternatively, based upon the tilt values obtained for the measured exposure fields 41, the wafer may be divided into various regions wherein all exposure processes performed in a specific region are adjusted based upon the tilt values obtained for that particular region.

In operation, the metrology tool 74 is used to obtain various critical dimension measurements for the features 38A in areas defined by one or more exposure fields 41. Based upon this metrology data, the controller 78 may determine the tilt of the layer of photoresist 38 in one or more directions. If the measured values for the TOP/BOTTOM TILT (45TB) and/or LEFT/RIGHT TILT (45LR) exceed a pre-established allowable limit, then this information may be used to control one or more aspects of the stepper exposure process. More particularly, if the metrology data so indicates, the controller 78 may modify one or more parameters of the stepper exposure process to be performed in the stepper tool 76 on subsequently processed wafers 79 (see FIG. 8). For example, the subsequently processed wafers 79 may be positioned closer to the light source of the stepper tool 76, or the tilt of the light or lens within the light source of the stepper may be adjusted. In short, the controller 78 may use the critical dimension metrology data to determine how well the exposure process is performing in terms of producing photoresist features 38A having desired critical dimension measurements and profiles. If necessary, the controller 78 may modify one or more parameters of the exposure process, e.g., a tilt angle of a reticle, a tilt angle of the exposing light, positioning of the wafer relative to a focal plane of the exposure process (focus offset), the tilt of the wafer, etc., to compensate for the unacceptable variations in photoresist features.

More specifically, based upon engineering tests, a table or correlation may be established between the tilt of the layer 38 and adjustments to be made in performing the stepper exposure process on a subsequently processed wafer. For example, a look-up table may be created that establishes the adjustments to be made to one or more parameters of the stepper exposure process in relation to incremental values of the vertical tilt that exceed, for example, a preselected value. By way of example only, the engineering tests referenced above may lead to the conclusion that acceptable results are obtained when the vertical tilt (45TB) of the layer 38 is less than 10 nm. In that case, the look-up table would provide adjustments to one or more aspects of the stepper exposure process, e.g., focal plane offset, light source tilt, etc., for incremental values by which the measured tilt exceeds the allowable tilt of 10 nm. Thus, for a measured vertical tilt (45TB) of 12 nm, the look-up table may provide that only adjustments need to be made to the wafer tilt to compensate for the excessive tilt in the layer 38. If the measured tilt (45TB) is, for example, 20 nm, the look-up table may provide that changes to both the tilt of the exposing light and to exposure offset may need to be made. Once the controller 78 has determined the tilt of the layer 38, it may then consult the look-up table to determine the appropriate corrective action to be taken with respect to the operating parameters of the stepper tool. Of course, the look-up table may contain a vast number of values and associated corrections to be made to the stepper tool 76.

Control equations may also be employed to adjust the operating recipe of the stepper tool 76 in situations where the methods described herein indicate that an adjustment is warranted. The control equations may be developed empirically using commonly known linear or non-linear techniques. The controller 78 may automatically control the operating recipes of the stepper tool 76 used to perform an exposure process on the subsequently processed wafers. Through use of the present invention, the extent and magnitude of variations in targeted DICD dimensions in a patterned layer of photoresist may be reduced.

In one illustrative embodiment, the method disclosed herein comprises forming a masking layer above a process layer, the masking layer having a plurality of features formed therein, measuring at least one critical dimension of a plurality of features positioned within at least one exposure field of a stepper exposure process used in forming the features, and determining a tilt of the masking layer within at least one exposure field based upon the measured critical dimensions of the plurality of features.

In one illustrative embodiment, the system disclosed herein comprises a metrology tool adapted to measure at least one critical dimension of a plurality of features in a masking layer and a controller for determining a tilt of the masking layer based upon the measured critical dimensions of said plurality of features.

Through use of the present invention, better process control may be achieved in modern integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a masking layer above a process layer, said masking layer having a plurality of features formed therein;
   measuring at least one critical dimension of a plurality of said features positioned within at least one exposure field of a stepper exposure process used in forming said features, wherein measuring at least one critical dimension of said plurality of features comprises measuring a top critical dimension or a bottom critical dimension of said plurality of features; and
   determining a tilt of said masking layer within said at least one exposure field based upon said measured at least one critical dimension of said plurality of features.

2. The method of claim 1, further comprising modifying at least one parameter of a stepper exposure process to be performed on at least one subsequently processed wafer based upon said determined tilt of said masking layer.

3. The method of claim 1, further comprising determining the acceptability of a stepper exposure process to be performed on at least one subsequently processed wafer based upon said determined tilt of said masking layer.

4. The method of claim 1, further comprising modifying at least one parameter of a stepper exposure process to be performed on at least one subsequently processed wafer if said determined tilt of said masking layer exceeds a preselected value.

5. The method of claim 1, further comprising determining the acceptability of a stepper exposure process to be performed on at least one subsequently processed wafer if said determined tilt of said masking layer is less than a preselected value.

6. The method of claim 2 or claim 4, wherein modifying at least one parameter of said stepper exposure process to be performed on a subsequently processed wafer comprises modifying at least one of a focal plane position, a tilt angle of a reticle, a position of said wafer, a tilt of said wafer and a tilt angle of a light emitting from a light source.

7. The method of claim 1, wherein forming a masking layer comprises forming a masking layer comprised of a photoresist material.

8. The method of claim 1, wherein measuring at least one critical dimension of a plurality of said features positioned within at least one exposure field of a stepper exposure process used in forming said features comprises measuring at least one critical dimension of each of a plurality of said features in each of a plurality of exposure fields of a stepper exposure process used in forming said features.

9. The method of claim 1, wherein determining a tilt of said masking layer comprises determining an effective critical dimension profile of each of said plurality of measured features.

10. The method of claim 1, wherein determining a tilt of said masking layer comprises determining a vertical tilt of said masking layer by comparing an effective critical dimension profile of a plurality of features positioned proximate a top surface of said exposure field with an effective critical dimension profile of a plurality of features positioned proximate a bottom surface of said exposure field.

11. The method of claim 1, wherein determining a tilt of said masking layer comprises determining a horizontal tilt of said masking layer by comparing an effective critical dimension profile of a plurality of features positioned proximate a first side surface of said exposure field with an effective critical dimension profile of a plurality of features positioned proximate a second side surface of said exposure field.

12. The method of claim 1, wherein measuring at least one critical dimension of a plurality of said features positioned within at least one exposure field of a stepper exposure process used in forming said features comprises measuring at least one critical dimension of at least four of said features positioned within at least one exposure field of a stepper exposure process used in forming said features.

13. The method of claim 1, wherein measuring at least one critical dimension of a plurality of said features positioned within at least one exposure field of a stepper exposure process used in forming said features comprises measuring a top and a bottom critical dimension of each of four of said features positioned within each of three exposure fields of a stepper exposure process used in forming said features.

14. A method, comprising:
   forming a layer of photoresist above a process layer, said layer of photoresist having a plurality of features formed therein;
   measuring at least a top and a bottom critical dimension of a plurality of said features positioned within at least one exposure field of a stepper exposure process used in forming said features; and
   determining a tilt of said layer of photoresist within said at least one exposure field based upon said measured top and bottom critical dimension of said plurality of features.

15. The method of claim 14, further comprising modifying at least one parameter of a stepper exposure process to be performed on at least one subsequently processed wafer based upon said determined tilt of said layer of photoresist.

16. The method of claim 14, further comprising determining the acceptability of a stepper exposure process to be performed on at least one subsequently processed wafer based upon said determined tilt of said layer of photoresist.

17. The method of claim 14, further comprising modifying at least one parameter of a stepper exposure process to be performed on at least one subsequently processed wafer if said determined tilt of said layer of photoresist exceeds a preselected value.

18. The method of claim 15 or claim 17, wherein modifying at least one parameter of said stepper exposure process to be performed on a subsequently processed wafer comprises modifying at least one of a focal plane position, a tilt angle of a reticle, a position of said wafer, a tilt of said wafer and a tilt angle of a light emitting from a light source.

19. The method of claim 14, further comprising determining the acceptability of a stepper exposure process to be performed on at least one subsequently processed wafer if said determined tilt of said layer of photoresist is less than a preselected value.

20. The method of claim 14, wherein measuring at least a top and a bottom critical dimension of a plurality of said features positioned within at least one exposure field of a stepper exposure process used in forming said features comprises measuring at least a top and a bottom critical dimension of a plurality of said features in each of a plurality of exposure fields of a stepper exposure process used in forming said features.

21. The method of claim 14, wherein determining a tilt of said layer of photoresist comprises determining an effective critical dimension profile of each of said plurality of measured features.

22. The method of claim 14, wherein determining a tilt of said layer of photoresist comprises determining a tilt of said layer of photoresist in at least one of a vertical and a horizontal direction.

23. The method of claim 14, wherein determining a tilt of said layer of photoresist comprises determining a vertical tilt of said layer of photoresist by comparing an effective critical dimension profile of a plurality of features positioned proximate a top surface of said exposure field with an effective critical dimension profile of a plurality of features positioned proximate a bottom surface of said exposure field.

24. The method of claim 14, wherein determining a tilt of said layer of photoresist comprises determining a horizontal tilt of said layer of photoresist by comparing an effective critical dimension profile of a plurality of features positioned proximate a first side surface of said exposure field with an effective critical dimension profile of a plurality of features positioned proximate a second side surface of said exposure field.

25. The method of claim 14, wherein measuring at least a top and a bottom critical dimension of a plurality of said features positioned within at least one exposure field of a stepper exposure process used in forming said features comprises measuring at least a top and a bottom critical dimension of at least four of said features positioned within at least one exposure field of a stepper exposure process used in forming said features.

26. The method of claim 14, wherein measuring at least a top and a bottom critical dimension of a plurality of said features positioned within at least one exposure field of a stepper exposure process used in forming said features comprises measuring at least a top and a bottom critical dimension of each of four of said features positioned within each of three exposure fields of a stepper exposure process used in forming said features.

27. A method, comprising:
forming a layer of photoresist above a process layer, said layer of photoresist having a plurality of features formed therein;
measuring a top and a bottom critical dimension of each of at least four of said features positioned within each of at least three exposure fields of a stepper exposure process used in forming said features; and
determining a tilt of said layer of photoresist within each of at least two of said exposure fields based upon said measured top and bottom critical dimension of said plurality of features within each of said exposure fields.

28. The method of claim 27, further comprising modifying at least one parameter of a stepper exposure process to be performed on at least one subsequently processed wafer based upon said determined tilt of said layer of photoresist.

29. The method of claim 27, further comprising determining the acceptability of a stepper exposure process to be performed on at least one subsequently processed wafer based upon said determined tilt of said layer of photoresist.

30. The method of claim 27, further comprising modifying at least one parameter of a stepper exposure process to be performed on at least one subsequently processed wafer if said determined tilt of said layer of photoresist within any of said at least two exposure fields exceeds a preselected value.

31. The method of claim 28 or claim 30, wherein modifying at least one parameter of said stepper exposure process to be performed on a subsequently processed wafer comprises modifying at least one of a focal plane position, a tilt angle of a reticle, a position of said wafer, a tilt of said wafer and a tilt angle of a light emitting from a light source.

32. The method of claim 27, further comprising determining the acceptability of a stepper exposure process to be performed on at least one subsequently processed wafer if said determined tilt of said layer of photoresist in each of said at least two exposure fields is less than a preselected value.

33. The method of claim 27, wherein determining a tilt of said layer of photoresist comprises determining an effective critical dimension profile of each of said plurality of measured features in each of said at least two exposure fields.

34. The method of claim 27, wherein determining a tilt of said layer of photoresist comprises determining a tilt of said layer of photoresist in each of said at least two exposure fields in at least one of a vertical and a horizontal direction.

35. The method of claim 27, wherein determining a tilt of said layer of photoresist comprises determining a vertical tilt of said layer of photoresist by comparing, for each of said at least two exposure fields, an effective critical dimension profile of a plurality of features positioned proximate a top surface of said exposure field with an effective critical dimension profile of a plurality of features positioned proximate a bottom surface of said exposure field.

36. The method of claim 27, wherein determining a tilt of said layer of photoresist comprises determining a horizontal tilt of said layer of photoresist by comparing, for each of said at least two exposure fields, an effective critical dimension profile of a plurality of features positioned proximate a first side surface of said exposure field with an effective critical dimension profile of a plurality of features positioned proximate a second side surface of said exposure field.

37. A method, comprising:
forming a masking layer above a process layer, said masking layer having a plurality of features formed therein;
measuring at least one critical dimension of a plurality of said features positioned within at least one exposure field of a stepper exposure process used in forming said features, wherein measuring at least one critical dimension of said plurality of features comprises measuring a top critical dimension and a bottom critical dimension of said plurality of features; and determining a tilt of said masking layer within said at least one exposure field based upon said measured at least one critical dimension of said plurality of features.

38. The method of claim 37, further comprising modifying at least one parameter of a stepper exposure process to be performed on at least one subsequently processed wafer based upon said determined tilt of said masking layer.

39. The method of claim 37 further comprising determining the acceptability of a stepper exposure process to be performed on at least one subsequently processed wafer based upon said determined tilt of said masking layer.

40. The method of claim 37 further comprising modifying at least one parameter of a stepper exposure process to be performed on at least one subsequently processed wafer if said determined tilt of said masking layer exceeds a preselected value.

41. The method of claim 38 or claim 40, wherein modifying at least one parameter of said stepper exposure process to be performed on a subsequently processed wafer comprises modifying at least one of a focal plane position, a tilt angle of a reticle, a position of said wafer, a tilt of said wafer and a tilt angle of a light emitting from a light source.

42. The method of claim 37, further comprising determining the acceptability of a stepper exposure process to be performed on at least one subsequently processed wafer if said determined tilt of said masking layer is less than a preselected value.

43. The method of claim 37, wherein forming a masking layer comprises forming a masking layer comprised of a photoresist material.

44. The method of claim 37, wherein measuring at least one critical dimension of a plurality of said features positioned within at least one exposure field of a stepper exposure process used in forming said features comprises measuring at least one critical dimension of each of a plurality of said features in each of a plurality of exposure fields of a stepper exposure process used in forming said features.

45. The method of claim 37, wherein determining a tilt of said masking layer comprises determining an effective critical dimension profile of each of said plurality of measured features.

46. The method of claim 37, wherein determining a tilt of said masking layer comprises determining a vertical tilt of said masking layer by comparing an effective critical dimension profile of a plurality of features positioned proximate a top surface of said exposure field with an effective critical dimension profile of a plurality of features positioned proximate a bottom surface of said exposure field.

47. The method of claim 37, wherein determining a tilt of said masking layer comprises determining a horizontal tilt of said masking layer by comparing an effective critical dimension profile of a plurality of features positioned proximate a first side surface of said exposure field with an effective critical dimension profile of a plurality of features positioned proximate a second side surface of said exposure field.

48. The method of claim 37, wherein measuring at least one critical dimension of a plurality of said features positioned within at least one exposure field of a stepper exposure process used in forming said features comprises measuring at least one critical dimension of at least four of said features positioned within at least one exposure field of a stepper exposure process used in forming said features.

49. The method of claim 37, wherein measuring at least one critical dimension of a plurality of said features positioned within at least one exposure field of a stepper exposure process used in forming said features comprises measuring a top and a bottom critical dimension of each of four of said features positioned within each of three exposure fields of a stepper exposure process used in forming said features.

* * * * *